United States Patent [19]
Nevins et al.

[11] Patent Number: 5,949,886
[45] Date of Patent: Sep. 7, 1999

[54] SETTING A MICROPHONE VOLUME LEVEL

[76] Inventors: Ralph J. Nevins, 23A Heath St., Somerville, Mass. 02145; Nancy Gardner, 36 Middlesex St., Cambridge, Mass. 02140

[21] Appl. No.: 08/548,404
[22] Filed: Oct. 26, 1995
[51] Int. Cl.⁶ .................................................. H03G 3/00
[52] U.S. Cl. .............................................. 381/57; 381/104
[58] Field of Search .................................. 381/57, 58, 59, 381/83, 93, 95, 119, 122, 104, 109, 107

[56] References Cited

U.S. PATENT DOCUMENTS

| | | | |
|---|---|---|---|
| 4,773,094 | 9/1988 | Dolby | 381/58 |
| 4,829,578 | 5/1989 | Roberts . | |
| 4,993,060 | 2/1991 | Kelly . | |
| 5,036,538 | 7/1991 | Oken et al. . | |
| 5,291,558 | 3/1994 | Ross | 381/57 |
| 5,610,988 | 3/1997 | Miyahara | 381/68.4 |
| 5,640,450 | 6/1997 | Watanabe | 381/57 |
| 5,715,310 | 2/1998 | Hagqvist | 381/57 |

*Primary Examiner*—Vivian Chang
*Attorney, Agent, or Firm*—Fish & Richardson P.C.

[57] ABSTRACT

A microphone volume level controller, for use with a speech recognition system, sets a volume level of a microphone in response to measured environmental conditions. Parameters of an input signal generated by a microphone are measured at multiple microphone volume levels. Based on the measured parameters, a volume level is determined that compensates for environmental conditions. The microphone volume level is set to the determined volume level. Speech recognition system error conditions are detected by comparing input signal levels detected by a microphone at a lower volume level and a higher volume level. If the difference between the signal levels at the lower and higher signal levels falls below a predetermined threshold, the user is notified of a possible error condition.

25 Claims, 8 Drawing Sheets

SETTING A MICROPHONE VOLUME LEVEL

BACKGROUND

This invention relates to setting a microphone volume level.

Many speech recognition systems include sound cards having a fixed microphone volume level. Other sound cards have a variable microphone volume level. Typically, when a speech recognition system including a sound card having a variable volume level is loaded onto a host computer for the first time, the volume level is pre-set to a default level corresponding to average environmental conditions. Environmental conditions include background noise, microphone-type, sound card-type, and the user's voice.

If the environmental conditions are not average (e.g., the background noise is high and/or the user's voice is very high or low), the default volume level may prevent the microphone from effectively detecting the user's speech. In some cases, this may increase speech recognition errors, while in other more extreme cases, the speech recognition system may not be able to recognize any of the user's speech. In the extreme cases, the system does not respond when the user speaks. It may be difficult for the user to determine that a volume adjustment is necessary to render the system operational, and often, the user is not able to change the volume setting.

SUMMARY

In general, in one aspect, the invention features a microphone volume level controller, for use with a speech recognition system, that sets a volume level of a microphone in response to measured environmental conditions.

In general, in another aspect, the invention features setting a speech recognition system microphone volume level by measuring parameters of an input signal generated by a microphone at multiple microphone volume levels; determining, based on the measured parameters, a volume level that compensates for environmental conditions; and setting the microphone volume level to the determined volume level.

Implementations of the invention may include one or more of the following features. A maximum volume level may be determined that provides a maximum unclipped input signal. This may be done by comparing the parameters at a minimum volume level against a higher central volume level. If the minimum volume level compensates for environmental conditions better than the central volume level, the volume level is determined to be between the central and minimum volume levels. If the central volume level compensates for environmental conditions better than the minimum volume level, the volume level is determined to be between the central volume level and a maximum volume level. Determining a volume level that is between the central and minimum volume levels may be done by comparing the parameters at the minimum volume level to parameters at a volume level that is mid-way between the minimum and central volume levels; and, if the minimum volume level compensates for environmental conditions better than the mid-way volume level, determining a volume level that is between the mid-way and minimum volume levels. If the mid-way volume level compensates for environmental conditions better than the minimum volume level, a volume level is determined that is between the central and mid-way volume levels.

Determining a volume level that is between the central and maximum volume levels may be done by comparing the parameters at the central volume level to parameters at a volume level that is mid-way between the central and maximum volume levels; and, if the central volume level compensates for environmental conditions better than the mid-way volume level, determining a volume level that is between the mid-way and central volume levels. If the mid-way volume level compensates for environmental conditions better than the central volume level, a volume level may be determined that is between the maximum and mid-way volume levels.

The parameters may include a signal level and the determining may be done by comparing the signal level at a minimum volume level to the signal level at a maximum volume level; and, if the difference between the signal levels at the minimum and maximum signal levels falls below a predetermined threshold, notifying the user of a possible error condition. A user may be prompted to speak a predetermined phrase at each of the microphone volume levels. The measuring may be done by prompting a user for silence at each of the microphone volume levels. Before the measuring step a user may request that the microphone volume level be tested, and if such a user request is detected, the other steps are completed. Before the measuring step a user request to add a new user to the system may be detected, and, if the user request is detected, the steps are completed. Before completing the other steps, an initial volume level test may be performed. If the system fails, the steps may be completed.

Performing the volume test may include prompting the user to speak a predetermined phrase; and determining whether an average signal amplitude exceeds a predetermined threshold. Measured parameters at each of the microphone volume levels may be displayed, e.g., to diagnose speech recognition system error conditions. The environmental conditions may include background noise. The environmental conditions may include the user's voice or the microphone type or a sound card type.

In general, in another aspect, the invention features detecting speech recognition system error conditions by comparing input signal levels detected by a microphone at a lower volume level and a higher volume level; and, if the difference between the signal levels at the lower and higher signal levels falls below a predetermined threshold, notifying the user of a possible error condition.

The advantages of the invention may include one or more of the following.

Adjusting the speech recognition system's volume level to compensate for environmental conditions improves speech recognition accuracy. Automatic volume adjustment reduces volume level problems when the speech recognition system is first loaded. Selective testing permits volume level adjustment when environmental conditions change.

Other advantages and features will become apparent from the following description and from the claims.

DESCRIPTION

FIGS. 5 and 7–11 are computer screen displays of a Microphone Test window.

A speech recognition system's volume level is automatically tested when new users are added to the system, including when a first user is added after the system is initially loaded onto a host computer. Additionally, users may choose to test the volume level when environmental conditions change. After testing, the volume level is adjusted to compensate for environmental conditions, for example, the automatic adjustment may maximize volume level and signal level while reducing clipping. Compensating for environmental conditions improves speech recognition accuracy by providing a high quality speech signal.

Figure 1:
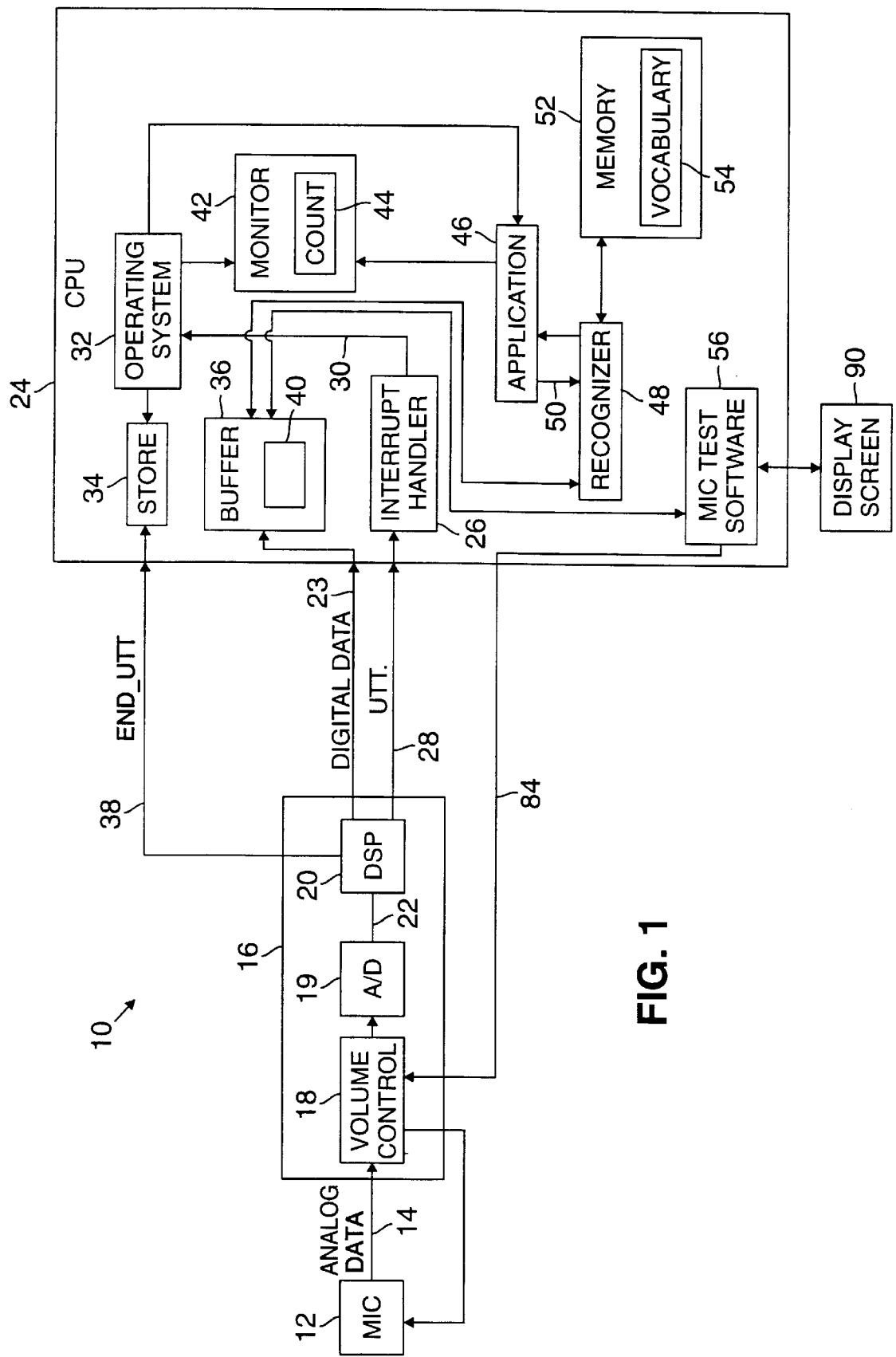
FIG. 1 is a block diagram of a speech recognition system.

Referring to FIG. 1, a speech recognition system 10 includes a microphone 12 for converting a user's speech into an analog data signal 14 and a sound card 16 including an adjustable volume control circuit 18, an analog-to-digital (A/D) converter 19, and a digital signal processor (DSP) 20. Volume control circuit 18 controls the volume level (or amplification) of analog signal 14, and A/D converter 19 converts the analog data signal into a digital data signal 22 by sampling the analog data signal at about 11 Khz to generate 220 digital samples during a 20 msec time period. Each 20 ms time period corresponds to a separate speech frame. The DSP processes the samples corresponding to each speech frame to generate a group of parameters associated with the analog data signal during the 20 ms period. Generally, the parameters represent the amplitude of the speech at each of a set of frequency bands.

The DSP also monitors the volume levels of the speech frames to detect user utterances. If the volumes in three consecutive speech frames within a window of five consecutive speech frames (i.e., three of the last five speech frames) exceed a predetermined speech threshold, for example, 20 dB, then the DSP determines that the analog signal represents speech and the DSP begins sending several, e.g., three, speech frames of data at a time (i.e., a batch) via a digital data signal 23 to a central processing unit (CPU) 24 (i.e., host computer). The DSP asserts an utterance signal (Utt) 28 to notify the CPU each time a batch of speech frames representing an utterance is sent on the digital data signal.

When an interrupt handler 26 on the CPU receives assertions of Utt signal 28, the CPU's normal sequence of execution is interrupted. Interrupt signal 30 causes operating system software 32 to call a store routine 34. Store routine 34 stores the incoming batch of speech frames into a buffer 36. When fourteen consecutive speech frames within a window of nineteen consecutive speech frames fall below a predetermined silence threshold, e.g., 6 dB, then the DSP stops sending speech frames to the CPU and asserts an End_Utt signal 38. The End_Utt signal causes the store routine to organize the batches of previously stored speech frames into a speech packet 40 corresponding to the user utterance.

Interrupt signal 30 also causes the operating system software to call monitor software 42. Monitor software 42 keeps a count 44 of the number of speech packets stored but not yet processed. An application 46, for example, a word processor, being executed by the CPU periodically checks for user input by examining the monitor software's count. If the count is zero, then there is no user input. If the count is not zero, then the application calls speech recognizer software 48 and passes a pointer 50 to the address location of the speech packet in buffer 30. The speech recognizer may be called directly by the application or may be called on behalf of the application by a separate program, such as Dragon-Dictate™ from Dragon Systems™ of West Newton, Mass., in response to the application's request for input from the mouse or keyboard.

When called, the speech recognizer retrieves speech packet 40 or a portion of the speech packet (i.e., recognition may start before the entire speech packet is stored) from buffer 30. The speech recognizer then compares speech frames within the speech packet to speech models in a vocabulary 52 stored in memory 54 to determine the likelihood that particular speech frames correspond to particular speech models. For a more detailed description of vocabulary 52, see U.S. Ser. No. 08/548,408, filed the same day as this application, entitled, "Structured Continuous Speech Recognition", and incorporated by reference. Each speech model in the vocabulary is a multidimensional probability distribution, each dimension of which represents the probability distribution for the values of a given speech frame parameter if its associated speech frame belongs to the class of sounds represented by the speech model.

For a more detailed description of how user utterances are received and stored within a speech recognition system, see U.S. Pat. No. 5,027,406, entitled "Method for Interactive Speech Recognition and Training", and incorporated by reference.

New Users

Figure 2A:
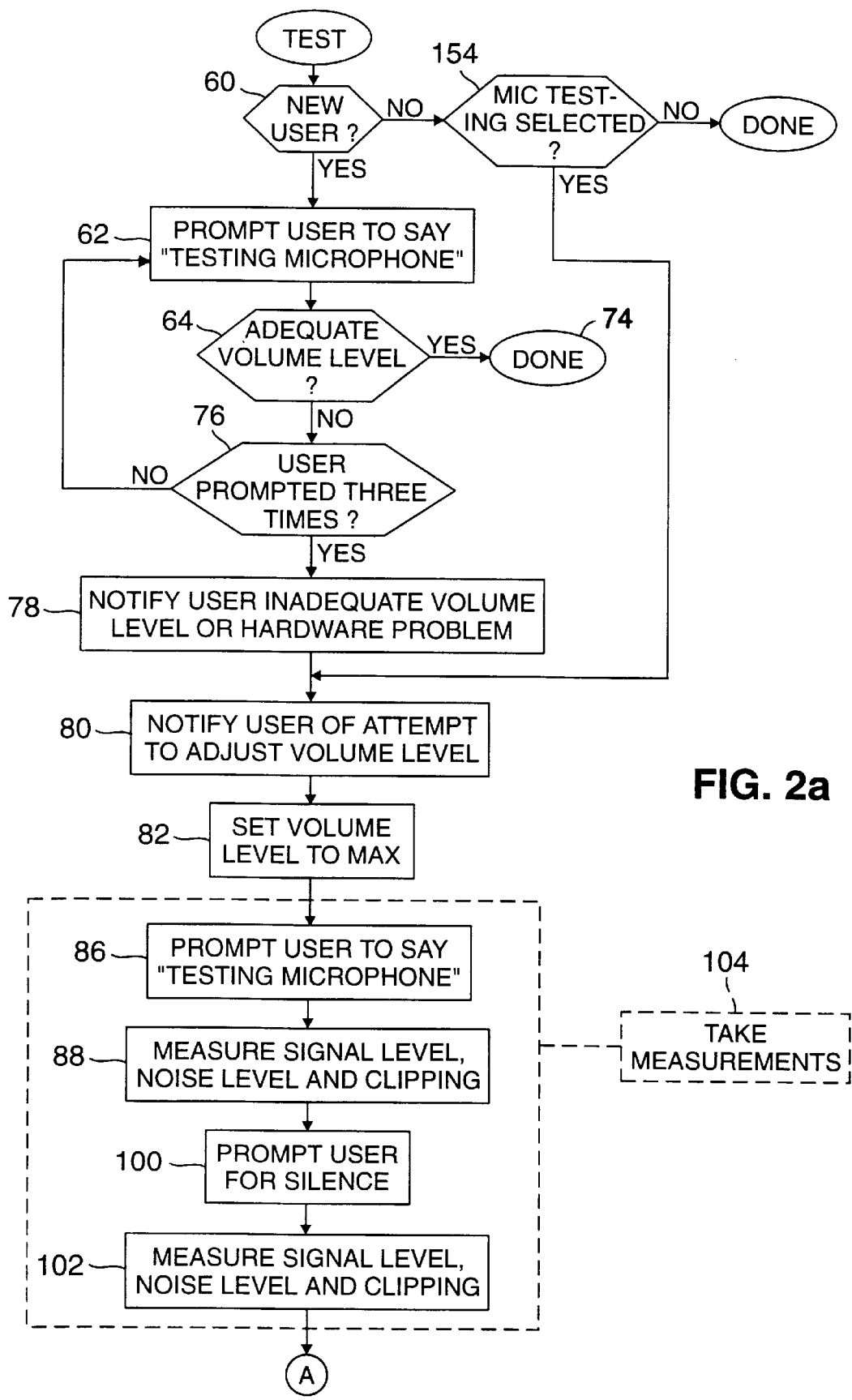
FIGS. 2a–2c are flow charts representing microphone volume level testing and adjustment.
Figure 2B:
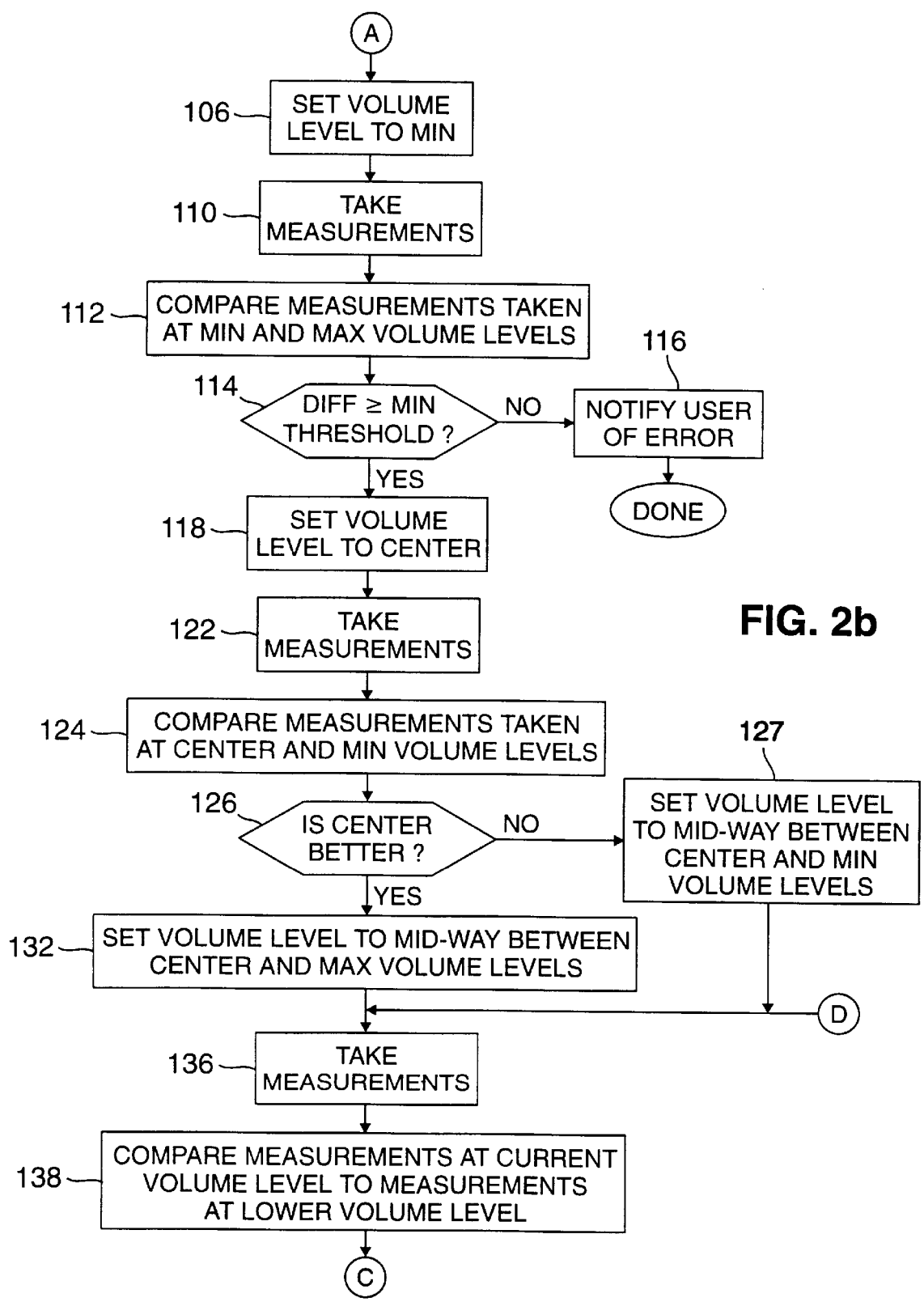
Figure 2C:
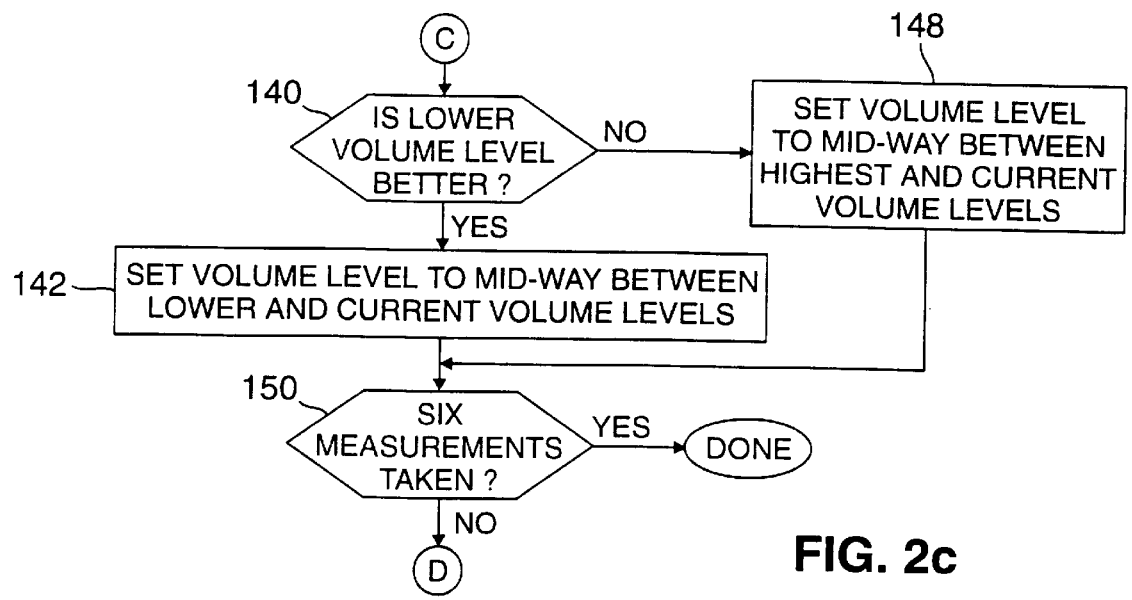

After the speech recognition system is first loaded onto CPU 24, the user adds himself or herself as a user causing the CPU to execute microphone test software 56. Referring to FIGS. 2a–2c, the CPU first determines (step 60) whether a new user is being added. If so, the CPU prompts (step 62) the user to say "Testing Microphone". Microphone 12 (FIG. 1) detects the user utterance and generates analog signal 14. A/D converter 19 samples the analog data signal and DSP 20 builds 33 ms speech frames representing the analog data signal. The speech frames are sent to the CPU via digital data signal 23 and stored in buffer 30.

Figure 3:
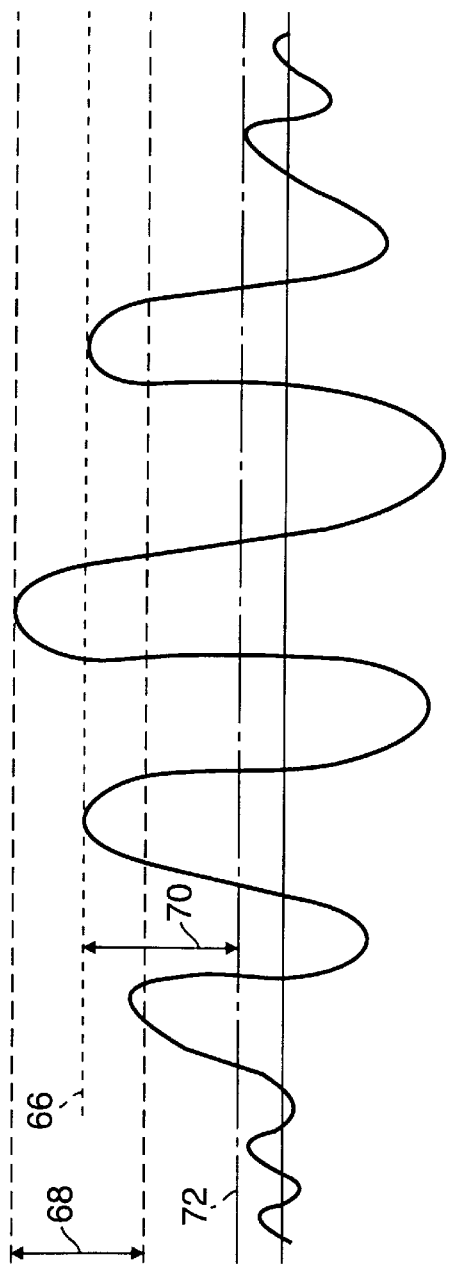
FIG. 3 is a schematic diagram of a speech signal with an adequate volume level.

The microphone test software then causes the CPU to examine the speech frames to determine (step 64) whether the speech frames represent an adequate volume level. Referring to FIG. 3, the volume level is adequate if, for example, the average amplitude (dashed line 66) of the signal, over the top 10 dB (arrow 68) of the signal, is at least 20 dB (arrow 70) above the background noise (dashed line 72). If the volume level is adequate, then the CPU is done (step 74) executing the microphone test software.

The volume level will not be adequate if the user did not say "Testing Microphone" when the CPU prompted the user (step 62). To allow the user to try again, the CPU repeats steps 62 and 64. A hardware problem may also cause an inadequate volume level and repeating steps 62 and 64 will not provide an adequate volume level. Thus, before repeating steps 62 and 64, the CPU determines (step 76) whether the user has been prompted a maximum number of times, for example, three. If not, then the CPU repeats step 62 and 64.

If the user has been prompted a maximum number of times, then the CPU notifies (step 78) the user that the microphone volume level is not set to an adequate level or that there may be a hardware problem. The CPU then notifies (step 80) the user that the system is going to attempt to adjust the volume level.

Figure 4:
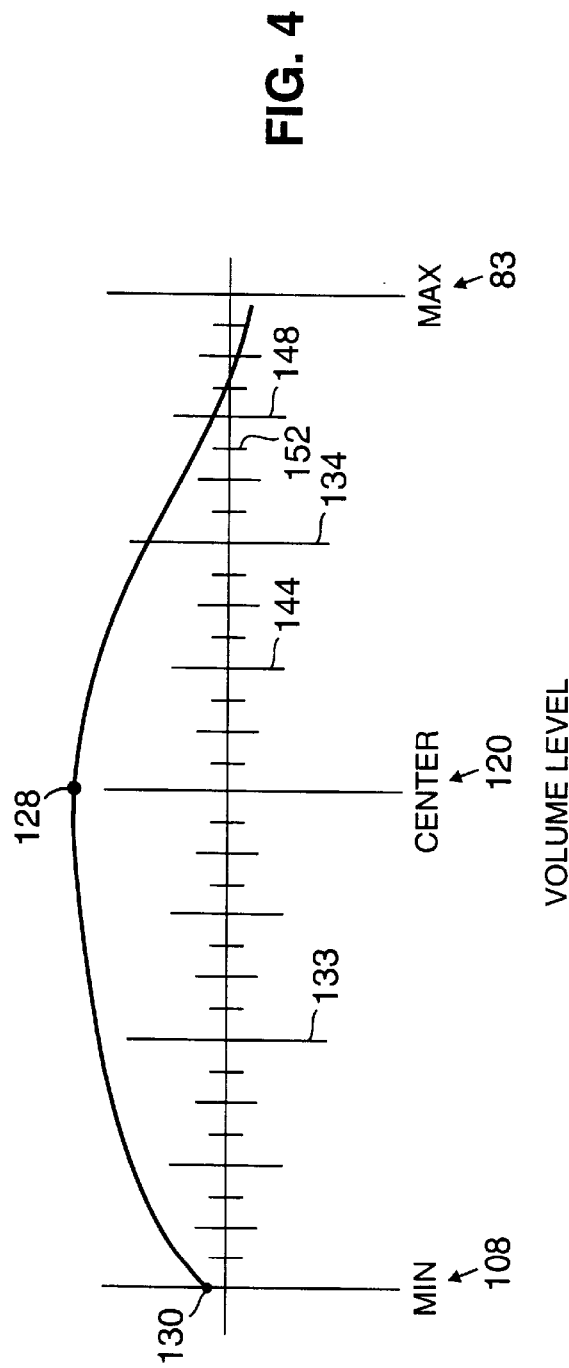
FIG. 4 is a schematic diagram of a volume level range.
Figures 5, 7:
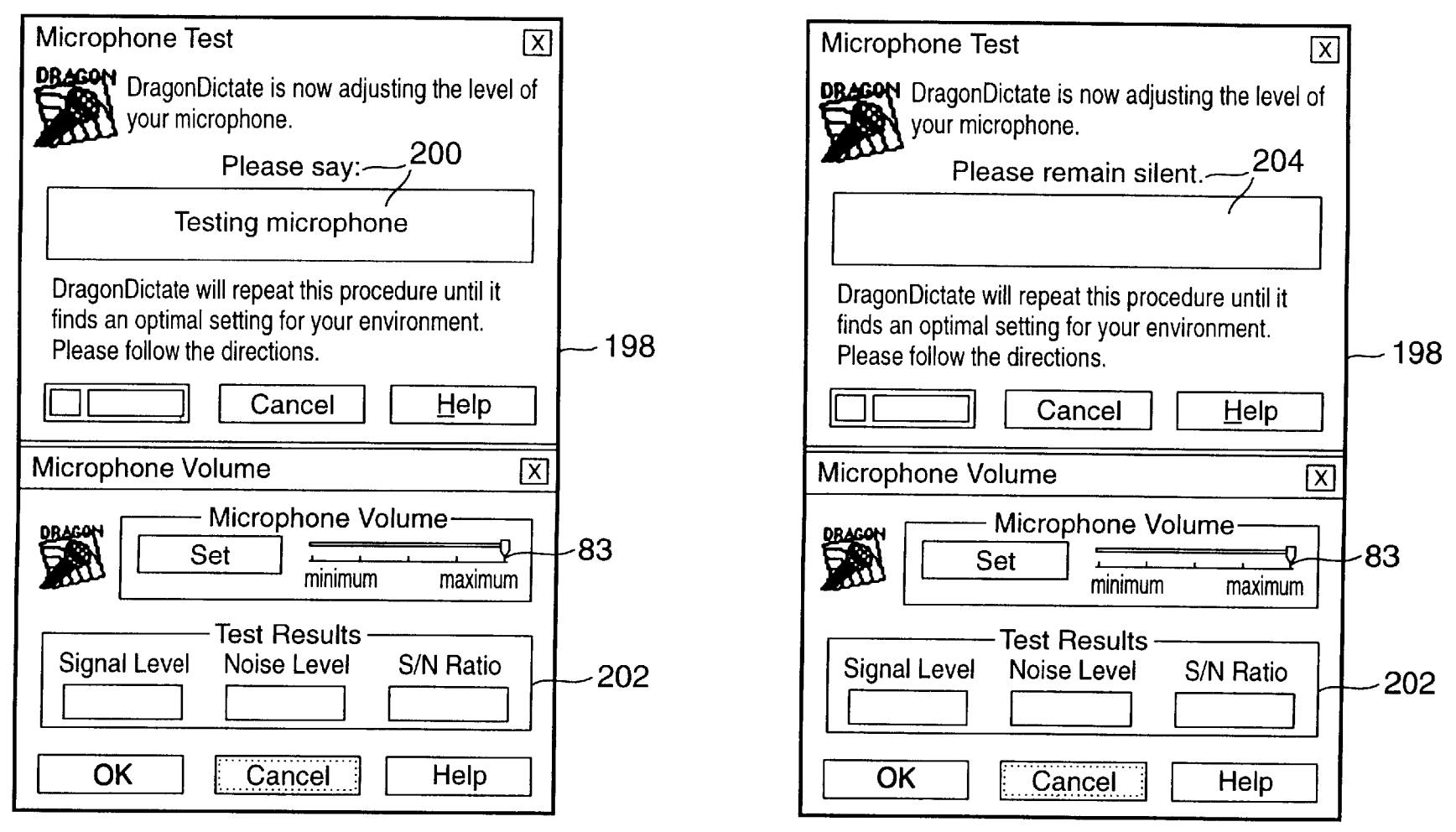

The CPU begins by setting (step 82) the volume level to a maximum value 83 (FIGS. 4 and 5). The maximum value is sound card dependent. To do this, the CPU sends a volume control signal 84 (FIG. 1) to volume control circuit 18 to cause the volume control circuit to set the microphone volume level to maximum value 83. The CPU then displays a Microphone Test window 198 on a display screen 90 (FIG. 1) and prompts (step 86) the user to say "Testing Microphone" 200 (FIG. 5). The CPU examines the speech frames representing the user's speech (i.e., "Testing Microphone") to measure (step 88) the signal level and the noise level and to determine if the signal is being clipped. The CPU also displays 202 (FIG. 5) the measured signal level, noise level, and signal-to-noise ratio in the Microphone Test window for the user.

Figure 6:
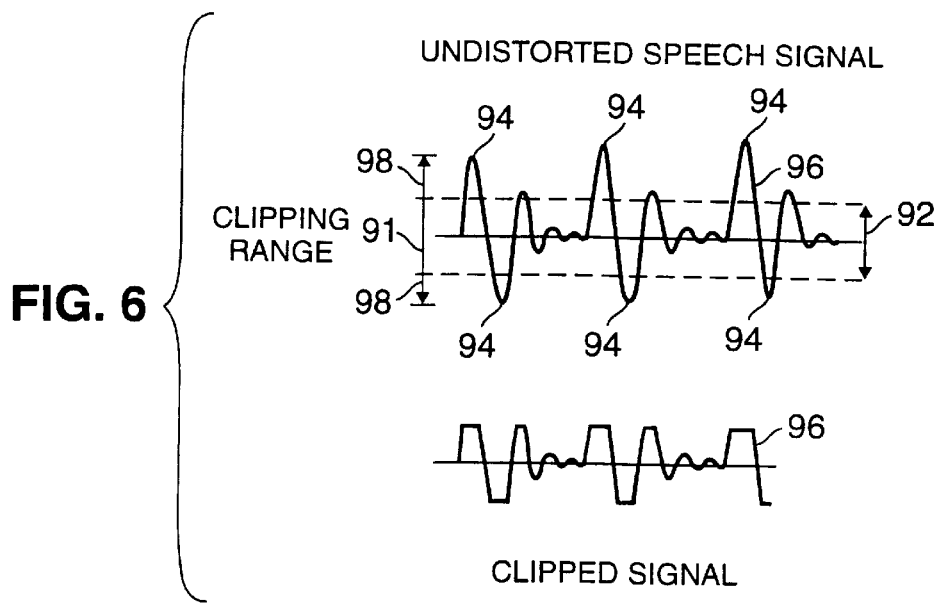
FIG. 6 is a schematic diagram of an undistorted speech signal and a clipped speech signal.

Referring to FIG. 6, the microphone has a signal range 91 that includes a desired reception range 92 and clipping ranges 98. If the microphone volume level is set too high, peaks of the signal, e.g., peaks 94, may be clipped from the analog signal 96 generated by the microphone. One method of determining whether signal 96 is being clipped is to determine whether peaks of the signal pass into clipping range 98, e.g., the top or bottom 6 dB or 12 dB of signal range 91. If peaks of the signal pass into the clipping range, then clipping is detected.

After measuring (step 88) the signal level and noise level and determining if the signal representing "Testing Microphone" is clipped, the CPU measures the background noise by prompting (step 100) the user for silence 204 (FIG. 7). The CPU then measures (step 102) the signal level and the noise level, and determines if the signal is; being clipped. Again, the CPU displays 202 (FIG. 7) the measured signal level, noise level, and signal-to-noise ratio on display screen 90 (FIG. 1) for the user. During the silence period, there is substantially no speech signal. Thus, the signal level is substantially 0 dB and the signal is not clipped.

Steps 86, 88, 100, and 102 are referred to throughout the remainder of the flow chart (FIGS. 2a–2c) and text as the single take measurements step (dashed box 104). Each time measurements are taken, the CPU displays the measured signal level, noise level, and signal-to-noise ratio on the display screen for the user.

Figures 8, 9:
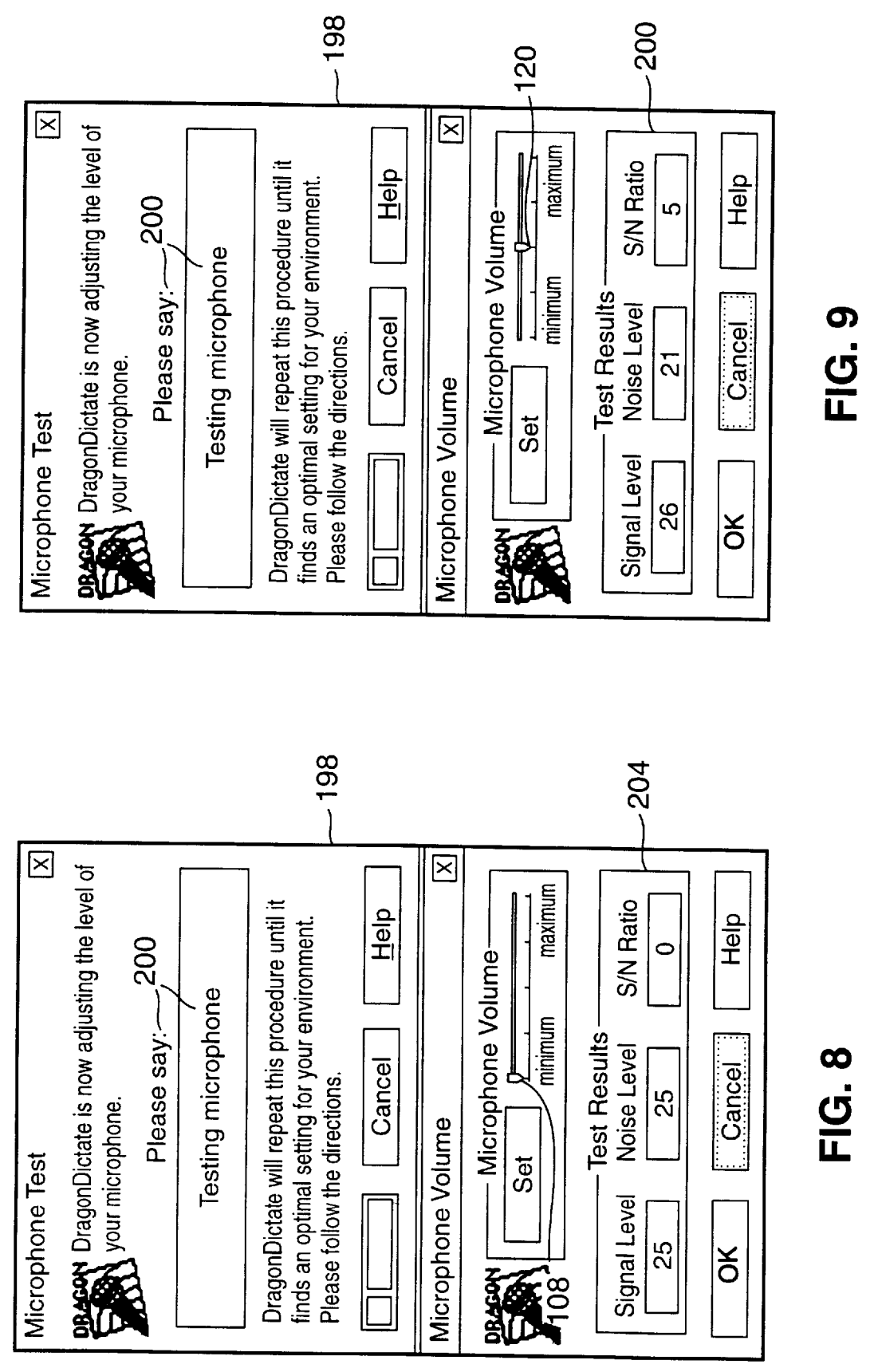

Next the CPU sets (step 106) the microphone volume level to its minimum value 108 (FIGS. 4 and 8) and again takes measurements (step 110). At the minimum volume level, the microphone should not detect any input (noise or signal), unless the sound card has a minimum volume level that is offset from zero. The CPU then compares (step 112) the measurements taken at the maximum volume level to the measurements taken at the minimum volume level.

If the CPU determines (step 114) that the differences between the signal and noise level measurements taken at the minimum and maximum volume levels are not greater than or equal to a minimum threshold, e.g., 5 dB, then the CPU notifies (step 116) the user that an error has been detected. The user may be notified to check that the microphone is properly connected to sound card 16 or that sound card 16 is properly connected to CPU 24. Similarly, the user may be notified to check the speech recognition system's trouble shooting documentation.

If the differences between the signal and noise level measurements taken at the minimum and maximum volume levels are greater than or equal to the minimum threshold, then the CPU sets (step 118) the microphone volume level to a Center level 120 (FIGS. 4 and 9) that is mid-way between the minimum and maximum volume levels and takes measurements (step 122). The CPU compares (step 124) the measurements taken at the Center and minimum volume levels and determines (step 126) whether the Center volume level is "better" than the minimum volume level.

A first volume level is considered to be "better" than a second volume level if there is signal clipping at the second volume level and no signal clipping at the first volume level. If there is no clipping at either volume level, then the first volume level is considered better if the signal level at the first volume level is higher than the signal level at the second volume level. If the signal levels at both volume levels are the same and there is no clipping, then the higher volume level is the better volume level.

For example, if the signal is being clipped at the Center volume level but not at the minimum volume level, then the minimum volume level is the better volume level. If there is no clipping at either volume level, but the signal level is higher (point 128, FIG. 4) at the Center volume level (which also has a higher volume level) than the signal level (point 130) at the minimum volume level, then the Center volume level is the better volume level. The signal level may be higher at lower volume levels where the sound card's amplifiers are non-linear.

Figure 10:
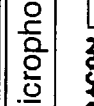

Typically, the CPU determines (step 126) that the Center volume level is a better volume level than the minimum volume level. The CPU then sets (step 132) the volume level mid-way 134 (FIGS. 4 and 10) between the Center and maximum volume levels and takes measurements (step 136). If the CPU determines (step 126) that the Center volume level is not the better volume level, then the CPU sets (step 127) the volume level mid-way 133 (FIG. 4) between the Center and minimum volume levels.

As an example, if the CPU determines (step 126) that the Center volume level is better than the minimum volume level, then the CPU compares (step 138) the measurements taken at the current volume level (volume level 134) to the measurements taken at the lower volume level (Center volume level 120). If the CPU determines (step 140) that the lower volume level (Center) is the better volume level, then the CPU sets (step 142) the volume level mid-way 144 (FIG. 4) between the lower volume level (Center) and the current volume level (134). If, on the other hand, the CPU determines (step 140) that the mid-way volume level 134 is the better volume level, then the CPU sets (step 146) the volume level mid-way 148 (FIG. 4) between the mid-way volume level (134) and the higher volume level (maximum volume level 83).

Figure 11:
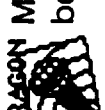

The CPU next determines (step 150) whether a maximum number of, for example, 6, measurements have been taken. If not, the CPU repeats steps 136–148 until the maximum number of measurements have been taken. The measurements lead to a best volume level setting, e.g., point 152 (FIGS. 4 and 11), for the current environmental conditions.

Selective Testing

If environmental conditions change, for example, the background noise significantly increases or decreases, a new microphone is installed, or a new sound card is installed, the user may cause the CPU to execute the microphone testing software by keystroke (e.g., typing a "test microphone" command), mouse selection (e.g., using a mouse to position the cursor over a test microphone icon and double-clicking a mouse button), or utterance (e.g., speaking "Test Microphone"). When the CPU executes the microphone testing software, the CPU determines (step 60) that a new user is not being added and then determines (step 154) that the user has requested that the microphone be tested. The CPU then repeats steps 82–150 to determine the best microphone volume level for the current environmental conditions.

Other embodiments are within the scope of the following claims.

For example, the user may have manual control over the sound card volume level (e.g., a volume knob) but the CPU may not have control over the sound card volume level. With such a system, the CPU may execute the microphone testing software and prompt the user to change the volume level manually before taking new measurements.

Even where the CPU has control over the sound card volume level, the user may be permitted to over-ride the CPU's setting by manually setting the volume level through a volume knob or through software by using a mouse to change the volume level indicator 208 (FIG. 11) in Microphone Test window 198.

As another example, instead of having a digital signal processor (DSP) process the samples corresponding to each speech frame to generate a group of parameters associated with the analog data signal during each 20 ms time period, the CPU includes front-end processing software that allows the CPU to generate the parameters.

As yet another example, the user or a trained technician may use the displayed information, e.g., measured signal level, noise level, and signal-to-noise ratio, to diagnose speech recognition system problems.

What is claimed is:

1. Apparatus for use with a speech recognition system, the apparatus comprising an electronic microphone volume level controller that automatically sets a volume level of a microphone in response to measured environmental conditions, wherein the controller is configured to:

measure parameters of an input signal generated by a microphone at multiple microphone volume levels;

determine, based on the measured parameters, a volume level that compensates for environmental conditions; and automatically set the microphone volume level to the determined volume level.

2. The apparatus of claim 1, wherein the controller is configured to:

compare the parameters at a minimum volume level against parameters at a higher volume level;

if the comparison indicates that the minimum volume level compensates for environmental conditions better than the higher volume level, determine a volume level that is between the higher and minimum volume levels as the volume level that compensates for environmental conditions; and if the comparison indicates that the higher volume level compensates for environmental conditions better than the minimum volume level, determine a volume level that is between the higher volume level and a maximum volume level as the volume level that compensates for environmental conditions.

3. The apparatus of claim 1, wherein the parameters include a signal level and the controller is configured to:

compare the signal level at a minimum volume level to the signal level at a maximum volume level; and if the difference between the signal levels at the minimum and maximum signal levels falls below a predetermined threshold, notify the user of a possible error condition.

4. The apparatus of claim 1, wherein the controller is configured to prompt a user to speak a predetermined phrase at each of the microphone volume levels.

5. The apparatus of claim 1, wherein the controller is configured to prompt a user for silence at each of the microphone volume levels.

6. A computer-implemented method for setting a speech recognition system microphone volume level, the method comprising:

measuring parameters of an input signal generated by a microphone at multiple microphone volume levels;

using a computer to determine, based on the measured parameters, a volume level that compensates for environmental conditions; and automatically setting the microphone volume level to the determined volume level.

7. The method of claim 6, wherein the step of using a computer includes determining a maximum volume level that provides a maximum unclipped input signal.

8. The method of claim 6, wherein the step of using a computer includes:

comparing the parameters at a minimum volume level against parameters at a higher volume level;

if the comparison indicates that the minimum volume level compensates for environmental conditions better than the higher volume level, determining a volume level that is between the higher and minimum volume levels as the volume level that compensates for environmental conditions; and if the comparison indicates that the higher volume level compensates for environmental conditions better than the minimum volume level, determining a volume level that is between the higher volume level and a maximum volume level as the volume level that compensates for environmental conditions.

9. The method of claim 8, wherein determining a volume level that is between the higher and minimum volume levels includes:

comparing the parameters at the minimum volume level to parameters at an additional volume level that is between the minimum and higher volume levels;

if the comparison indicates that the minimum volume level compensates for environmental conditions better than the additional volume level, determining a volume level that is between the additional and minimum volume levels as the volume level that compensates for environmental conditions; and if the comparison indicates that the additional volume level compensates for environmental conditions better than the minimum volume level, determining a volume level that is between the higher and additional volume levels as the volume level that compensates for environmental conditions.

10. The method of claim 8, wherein determining a volume level that is between the higher and maximum volume levels includes:

comparing the parameters at the higher volume level to parameters at an additional volume level that is between the higher and maximum volume levels;

if the comparison indicates that the higher volume level compensates for environmental conditions better than the additional volume level, determining a volume level that is between the additional and higher volume levels as the volume level that compensates for environmental conditions; and if the comparison indicates that the higher volume level compensates for environmental conditions better than the higher volume level, determining a volume level that is between the maximum and additional volume levels as the volume level that compensates for environmental conditions.

11. The method of claim 6, wherein the parameters include a signal level and the step of using a computer includes:

comparing the signal level at a minimum volume level to the signal level at a maximum volume level; and if the difference between the signal levels at the minimum and maximum signal levels falls below a predetermined threshold, notifying the user of a possible error condition.

12. The method of claim 6, wherein the step of measuring includes prompting a user to speak a predetermined phrase at each of the microphone volume levels.

13. The method of claim 12, wherein the step of measuring includes prompting a user for silence at each of the microphone volume levels.

14. The method of claim 6, further comprising, before the measuring step:

detecting a user request that the microphone volume level be tested, and if the user request is detected, completing the steps of claim 2.

15. The method of claim 6, further comprising, before the measuring step:

detecting a user request to add a new user to the system, and if the user request is detected, completing the steps of claim 2.

16. The method of claim 15, further comprising, before completing the steps of claim 2:

performing an initial volume level test, and if the system fails, completing the steps of claim 2.

17. The method of claim 16 wherein the step of performing includes:

prompting the user to speak a predetermined phrase; and determining whether an average signal amplitude exceeds a predetermined threshold.

18. The method of claim 6, further comprising:

displaying the measured parameters at each of the microphone volume levels.

19. The method of claim 18, further comprising:

using the displayed measured parameters to diagnose speech recognition system error conditions.

20. The method of claim 6, wherein the environmental conditions include background noise.

21. The method of claim 6, wherein the environmental conditions include the user's voice.

22. The method of claim 6, wherein the environmental conditions include the microphone type.

23. The method of claim 6, wherein the environmental conditions include a sound card type.

24. The method of claim 8, wherein the higher volume level is mid-way between the minimum volume level and the maximum volume level.

25. A computer-implemented method for setting a speech recognition system microphone volume level, the method comprising:

measuring parameters of an input signal generated by a microphone at multiple microphone volume levels, by:

prompting a user to speak a predetermined phrase at each of the microphone volume levels, and prompting the user for silence at each of the microphone volume levels;

using a computer to determine, based on the measured parameters, a volume level that compensates for environmental conditions; and automatically setting the microphone volume level to the determined volume level.

* * * * *